(12) United States Patent
Hanson et al.

(10) Patent No.: US 12,200,873 B2
(45) Date of Patent: Jan. 14, 2025

(54) METHOD OF MANUFACTURING A PRINTED CIRCUIT BOARD AND PRINTED CIRCUIT BOARDS FORMED THEREBY

(71) Applicant: ACULON, INC., San Diego, CA (US)

(72) Inventors: Eric Lee Hanson, Carlsbad, CA (US); Dean Potter, San Diego, CA (US); Mario Gattuso, San Diego, CA (US); Andres Hanau, San Diego, CA (US)

(73) Assignee: ACULON INC., San Diego, CA (US)

( * ) Notice: Subject to any disclaimer, the term of this patent is extended or adjusted under 35 U.S.C. 154(b) by 136 days.

(21) Appl. No.: 17/729,254

(22) Filed: Apr. 26, 2022

(65) Prior Publication Data

US 2022/0256713 A1 Aug. 11, 2022

Related U.S. Application Data

(62) Division of application No. 15/809,984, filed on Nov. 10, 2017, now abandoned.

(51) Int. Cl.
| | | |
|---|---|---|
| H05K 3/28 | (2006.01) | |
| C09D 5/04 | (2006.01) | |
| C09D 127/12 | (2006.01) | |
| C09D 133/16 | (2006.01) | |

(52) U.S. Cl.
CPC ............ H05K 3/285 (2013.01); C09D 5/04 (2013.01); C09D 127/12 (2013.01); C09D 133/16 (2013.01); *H05K 2201/015* (2013.01); *H05K 2201/09872* (2013.01)

(58) Field of Classification Search
CPC ............. H05K 3/28; H05K 2203/13; H05K 2203/1333; H05K 2203/1361; H05K 2203/1366; H05K 2203/1377; H05K 2201/015
See application file for complete search history.

(56) References Cited

U.S. PATENT DOCUMENTS

| | | | |
|---|---|---|---|
| 4,136,225 A * | 1/1979 | Feit | B23K 35/224 427/63 |
| 4,968,446 A | 11/1990 | Ahmed et al. | |
| 5,800,859 A | 9/1998 | Price et al. | |
| 6,149,992 A | 11/2000 | Nakayama | |
| 6,419,992 B1 * | 7/2002 | Lewin | B05D 7/14 427/241 |
| 2004/0241323 A1 * | 12/2004 | Ylitalo | H05K 3/0058 427/398.1 |
| 2004/0241395 A1 * | 12/2004 | Jing | B41M 5/0023 428/195.1 |
| 2004/0241396 A1 * | 12/2004 | Jing | B41M 3/006 428/195.1 |
| 2010/0032420 A1 | 12/2010 | Maier et al. | |
| 2010/0324205 A1 | 12/2010 | Maier | |
| 2016/0137895 A1 | 5/2016 | Kontomaris | |

FOREIGN PATENT DOCUMENTS

| | | |
|---|---|---|
| EP | 1637543 A2 | 3/2006 |
| WO | 2013/090939 | 6/2013 |

OTHER PUBLICATIONS

Ishida et al., "Surface-Conditioning Effect of Gold Substrates on Octadecanethiol Self-Assembled Monolayer Growth," Langmuir 1997, 13, 4638-4643. (Year: 1997).*
Product Information for 3M NOVEC 7100 Engineering Fluid, issued Sep. 2009, 4 pages. (Year: 2009).*
Product Information for 3M NOVEC 7200 Engineering Fluid, issued Sep. 2009, 4 pages (Year: 2009).*
Guerre et al., "Solution self-assembly of fluorinated polymers, an overview," Polym. Chem., 2021, 00, 1-26. (Year: 2021).*
Clark et al., "The Use of Segregated Hydrofluoroethers as Cleaning Agents in Electronics Packaging Applications", International Conference on Soldering and Reliability Toronto, Ontario, Canada; May 20-22, 2009.

* cited by examiner

*Primary Examiner* — William P Fletcher, III
(74) *Attorney, Agent, or Firm* — Blynn L. Shideler; Krisanne Shideler; BLK Law Group

(57) ABSTRACT

A method of manufacturing a printed circuit board is provided, comprising: 1) imprinting an electrically conductive circuit pattern on a surface of a substrate; 2) applying a surface treatment composition to the surface of the substrate over the electrically conductive circuit pattern; and 3) allowing the surface treatment composition to form a self-assembled coating layer on the surface of the substrate in the form of a conformal coating. The surface treatment composition comprises: (a) a fluorine-containing polymer; (b) a solvent containing at least one C—F bond; and (c) a rheology modifying component. Also provided are electronic components of a circuit assembly and printed circuit boards, comprising a substrate and a self-assembled coating layer applied to at least one surface of the substrate. The coating layer is in the form of a conformal coating and is formed from the surface treatment composition described above.

5 Claims, No Drawings

METHOD OF MANUFACTURING A PRINTED CIRCUIT BOARD AND PRINTED CIRCUIT BOARDS FORMED THEREBY

CROSS-REFERENCE TO RELATED APPLICATION

This application is a divisional of U.S. patent application Ser. No. 15/809,984, filed Nov. 10, 2017, and titled "SURFACE TREATMENT COMPOSITIONS AND COATED ARTICLES PREPARED THEREFROM", now abandoned, which published May 16, 2019, as US 2019/0144646 A1, which application and publication are incorporated herein by reference in their entireties.

BACKGROUND OF THE INVENTION

Field of the Invention

The present invention relates to methods of manufacturing printed circuit boards using surface treatment compositions that demonstrate thixotropy, and to printed circuit boards prepared thereby.

Background of the Invention

The use of coatings to protect electronic circuitry from external environments is widely known and many different treatments exist to perform that function. However, there are currently no liquid, solution-based coatings that can provide a uniform coating thickness over the complex geometries of printed circuit boards. Chemical vapor deposition (e.g., vacuum-applied technologies) such as the application of parylene can make a true conformal coating. Unfortunately, vacuum-deposited coatings such as parylene-based treatments usually require labor-intensive masking of "keep-out" areas.

Conventional conformal coating solutions used on circuit boards will flow and level to some degree without being under external shear forces besides gravity. This causes the corners, edges, sidewalls to have a much thinner coating than the flat/recessed areas of the coated substrate, and when the coated circuitry is exposed to water while power is on, failure occurs at these areas. Therefore, in order for a printed circuit board to survive immersion in water while being powered up, a coating must be applied that will have uniform coverage regardless of surface topology.

It would be desirable to provide surface treatment compositions that deliver the benefits of conformal coatings yet eliminate the need for costly capital investment and avoid the bottlenecking caused by vacuum-based batch manufacturing processes or masking operations.

SUMMARY OF THE INVENTION

Methods of manufacturing a printed circuit board are provided comprising the steps of:
1) imprinting an electrically conductive circuit pattern on a surface of a substrate;
2) applying a surface treatment composition to the surface of the substrate over the electrically conductive circuit pattern; and
3) allowing the surface treatment composition to form a self-assembled coating layer on the surface of the substrate in the form of a conformal coating, wherein the surface treatment composition comprises:
   (a) a fluorine-containing polymer;
   (b) a solvent containing at least one C—F bond; and
   (c) a rheology modifying component.

Also provided are electronic components of a circuit assembly, comprising:
(i) a substrate; and
(ii) a self-assembled coating layer applied to at least one surface of the substrate. The coating layer is in the form of a conformal coating and is formed from the surface treatment composition above.

Also provided are printed circuit boards, comprising:
(i) a substrate;
(ii) an electrically conductive circuit pattern imprinted on a surface of the substrate; and
(iii) a self-assembled coating layer applied to at least one surface of the substrate over the electrically conductive circuit pattern. The coating layer is in the form of a conformal coating and is formed from the surface treatment composition described above.

Further advantages and aspects of the present invention are set forth in the Detailed Description of the Invention.

DETAILED DESCRIPTION OF THE INVENTION

Other than in any operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

As used in this specification and the appended claims, the articles "a," "an," and "the" include plural referents unless expressly and unequivocally limited to one referent.

The various aspects and examples of the present invention as presented herein are each understood to be non-limiting with respect to the scope of the invention.

The present invention provides methods of manufacturing a printed circuit board implementing surface treatment compositions that form self-assembled structures upon application to a substrate, and result in coatings of uniform thickness regardless of the surface topology of the article being coated. It has been discovered that particular combinations of polymer, solvent and rheological modifier can yield a coating composition that provides the correct balance of the delicate intramolecular interactions between the various components in order to generate self-assembled structures.

These self-assembled structures provide thixotropy to the composition and thus allow it to demonstrate dramatic changes in viscosity as a response to external stimuli, particularly the application of shear forces. Most importantly, these compositions will rapidly increase in viscosity when shear forces are removed, which allows for the coating composition to adhere to complex shapes without running (sag) or flowing. The resultant dried film will have a much greater uniformity in thickness compared to a coating composition that does not form such structures.

The surface treatment compositions of the present invention comprise (a) a fluorine-containing polymer. The polymers may be any polymers that contain fluorocarbon (i.e., C—F) units, such as —C(F)$_2$—, —C(F)(H)—, and/or terminal untis such as —C(F)$_x$(H)$_y$, wherein x is greater than or equal to 1 and x+y=3. Note that the phrase "and/or" when used in a list is meant to encompass alternative embodiments including each individual component in the list as well as any combination of components. For example, the list "A, B, and/or C" is meant to encompass seven separate embodiments that include A, or B, or C, or A+B, or A+C, or B+C, or A+B+C. The fluorine-containing polymer (a) is most often a (meth)acrylic polymer.

By "(meth)acrylic" is meant polymers prepared from monomers having acrylic functional groups, polymers prepared from monomers having methacrylic functional groups, and/or polymers prepared from both types of monomers. The polymers are typically prepared from acrylic and methacrylic monomers such as acrylic acid, methacrylic acid, and esters thereof. Useful alkyl esters of acrylic acid or methacrylic acid include aliphatic alkyl esters containing from 1 to 30, and often 4 to 18 carbon atoms in the alkyl group. Non-limiting examples include methyl methacrylate, ethyl methacrylate, butyl methacrylate, ethyl acrylate, butyl acrylate, and 2-ethyl hexyl acrylate. Suitable other copolymerizable ethylenically unsaturated monomers include vinyl aromatic compounds such as styrene and vinyl toluene; nitriles such as acrylonitrile and methacrylonitrile; vinyl and vinylidene halides such as vinyl chloride and vinylidene fluoride, vinyl esters such as vinyl acetate or ethers such as vinyl trifluoromethyl ether. Fluoro-functional monomers such as monofluoroethylene, difluoroethylene, trifluoroethylene, and tetrafluoroethylene are suitable for imparting fluoro functionality to the polymer.

(Meth)acrylic polymers can be prepared via known organic solution polymerization techniques. Generally any method of producing such polymers that is known to those skilled in the art utilizing art recognized amounts of monomers can be used.

The fluorine-containing polymer (a) typically demonstrates a weight average molecular weight (Mw) of 5,000 to 500,000; usually 25,000 to 250,000 Daltons as measured by gel permeation chromatography using a polystyrene standard. Particularly suitable methacrylic polymers include I500101, commercially available from Aculon, Inc.

The fluorine-containing polymer (a) is usually present in the surface treatment composition in an amount of 5 to 25 percent by weight, more often 12.5 to 17.5 percent by weight, based on the total weight of the surface treatment composition.

The surface treatment compositions of the present invention further comprise (b) a solvent containing at least one C—F bond. Examples include hydrofluoroether (HFE) solvents. Such solvents were developed originally as replacements for CFCs, HFCs, HCFCs, and PFCs. An advantage of using an HFE solvent is its short atmospheric lifetime and zero ozone depletion potential compared to alternative chemicals.

Examples of particular hydrofluoroether solvents include 1,1,1,2,2,3,3,4,4-nonafluoro-4-methoxybutane and/or 1,1,1,2,2,3,3,4,4-nonafluoro-4-ethoxybutane, commercially available from 3M Corporation as NOVEC 7200. Other exemplary solvents include 3-ethoxyperfluoro(2-methylhexane) (HFE 7500, also available from 3M Corporation); 1H,1H,5H-Octafluoropentyl-1,1,2,2-tetrafluoroethyl ether (HFE 6512, available from Fuxin Hengtong); and/or 1,1,1,2,3,4,4,5,5,5-Decafluoropentane (Vertrel XF, available from E. I. DuPont de Nemours).

The solvent (b) is usually present in the surface treatment composition in an amount of 75 to 90 percent by weight, more often 75 to 89 percent by weight, based on the total weight of the surface treatment composition.

The surface treatment compositions of the present invention further comprise (c) a rheology modifying component. Fumed silica that is surface modified with hydrophobic functional groups is a particularly suitable rheology modifying component. The fumed silica contributes to the thixotropic nature of the surface treatment composition of the present invention. By "hydrophobic" is meant that the functional groups have non-polar properties and have a tendency to interact with, be miscible with, or be dissolved by non-polar solvents such as alkanes and oils.

Fumed silica is formed from microscopic droplets of amorphous silica fused into branched, chainlike, three-dimensional secondary particles which then agglomerate into tertiary particles. It is manufactured by flame pyrolysis of silicon tetrachloride or from quartz sand vaporized in a 3000° C. electric arc. The resulting powder has an extremely low bulk density (often 160-190 kg/m3) and high surface area (usually 50-600 m2/g). Hydrophobic functional groups with which the silica particle surfaces may be modified include hexamethyldisiloxane, dichlorodimethylsilane, trimethylchlorosilane, octadecyldimethylchlorosilane, chlorinated poly(dimethylsiloxane), and the like. Particularly suitable fumed silica is commercially available from Cabot Corporation and Evonik Industries.

The rheology modifying component (c) is usually present in the surface treatment composition in an amount of 1 to 5 percent by weight, more often 1.5 to 2.5 percent by weight, based on the total weight of the surface treatment composition.

The surface treatment compositions of the present invention typically demonstrate a thixotropic index greater than 2. Thixotropic index is defined as the ratio of the viscosity under slow speed shear to the viscosity under high speed shear of a non-Newtonian fluid. It is used as a tool to define how well the fluid will hang or resist sagging under gravity. The thixotropic index is obtained by measuring the viscosity of a fluid at ambient temperature. Ambient temperature typically ranges from 60 to 90° F. (15.6 to 32.2° C.), such as a typical room temperature, 72° F. (22.2° C.). A viscometer is used to measure the viscosity at two speeds (one is a multiple or a factor of 10 of the other). The index is calculated by dividing the viscosity at the lower speed shear by the viscosity at the higher speed shear.

In a particular example of the present invention, the surface treatment composition comprises (a) a (meth)acrylic fluorine-containing polymer; (b) a hydrofluoroether solvent; and (c) fumed silica that is surface modified with hydrophobic functional groups.

The surface treatment compositions of the present invention are suitable for use in preparing coated articles such as coated circuit boards yielding improved methods of manufacturing a printed circuit board. The coated articles of the present invention comprise a substrate (i). Substrates suitable for use in the preparation of the coated articles of the present invention can include a metal such as copper or steel, or any substrate commonly used in the preparation of circuit assemblies, such as polyepoxides, including fiberglass reinforced polyepoxides, polyimides, phenolics, and fluorocarbons. The polymeric substrates may comprise an electrically conductive circuit pattern imprinted in (such as in the case of a blind via) or on the substrate surface. Often the substrate is an electronic component of a circuit assembly, such as a printed circuit board.

The substrate may take any shape as desired for the intended application, such as flat, curved, bowl-shaped, tubular, or freeform. For example, the substrate may be in the form of a flat plate having two opposing surfaces, such as would be suitable for use in an electronic circuit assembly as a circuit board.

Prior to application of any coatings, the substrate may be cleaned such as by argon plasma treatment, or with a solvent, such as Ionox I3416 or Cybersolv 141-R, both available from Kyzen.

The coated articles of the present invention further comprise a self-assembled coating layer (ii) applied to at least one surface of the substrate. The coating layer comprises any of the surface treatment compositions described above.

The coating layer may be applied to the substrate by one or more of a number of methods such as spraying, dipping (immersion), spin coating, or flow coating onto a surface thereof.

The self-assembled coating layer typically demonstrates a dry film thickness (DFT) of 5 to 100 microns. The coating layer demonstrates a very uniform thickness over the surface of the substrate and serves as a conformal coating. The dry film thickness of the coating layer over the surface of the substrate typically varies by no more than 50 percent.

The present invention provides a method of manufacturing a printed circuit board, comprising the steps of: 1) imprinting an electrically conductive circuit pattern on a surface of a substrate; 2) applying a surface treatment composition to the surface of the substrate over the electrically conductive circuit pattern; and 3) allowing the surface treatment composition to form a self-assembled coating layer on the surface of the substrate in the form of a conformal coating, wherein the surface treatment composition comprises: (a) a fluorine-containing polymer; (b) a solvent containing at least one C—F bond; and (c) a rheology modifying component. The method of the present invention provides wherein the substrate comprises at least one of copper, steel, a polyepoxide, fiberglass reinforced polyepoxide, a polyimide, a phenolic polymer, and a fluorocarbon polymer, and wherein the substrate is cleaned by argon plasma treatment or with a solvent prior to imprinting the electrically conductive circuit pattern on the surface of the substrate. The method of the present invention provides wherein the surface treatment composition is applied to the surface of the substrate by spraying, dipping (immersion), spin coating, or flow coating onto the surface, and wherein the surface treatment composition demonstrates a thixotropic index greater than 2 and wherein the fluorine-containing polymer (a) comprises a (meth)acrylic polymer; the solvent (b) comprises 3-ethoxyperfluoro(2-methylhexane), 1,1,1,2,2,3,3,4,4-nonafluoro-4-methoxybutane, 1,1,1,2,2,3,3,4,4-nonafluoro-4-ethoxybutane, 1,1,1,2,3,4,4,5,5,5-Decafluoropentane and/or 1H,1H,5H-Octafluoropentyl-1,1,2,2-tetrafluoroethyl ether; and the rheology modifying component (c) comprises fumed silica that is surface modified with hydrophobic functional groups, and wherein the fluorine-containing polymer (a) has a weight average molecular weight of 25,000 to 500,000.

Whereas particular embodiments of this invention have been described above for purposes of illustration, it will be evident to those skilled in the art that numerous variations of the details of the present invention may be made without departing from the scope of the invention as defined in the appended claims.

What is claimed is:

1. A method of manufacturing a printed circuit board, comprising:
   1) Imprinting an electrically conductive circuit pattern on a surface of a substrate;
   2) Applying a surface treatment composition to the surface of the substrate over the electrically conductive circuit pattern by immersion, spin coating, or flow coating the surface treatment composition onto the surface; and
   3) Allowing the surface treatment composition to form a self-assembled coating layer on the surface of the substrate in the form of a conformal coating, wherein the coating layer (ii) demonstrates a dry film thickness of 5 to 100 microns and wherein the dry film thickness of the coating layer over the surface of the substrate varies by no more than 50 percent; and wherein the surface treatment composition comprises:
      (a) a (meth) acrylic fluorine-containing polymer having a weight average molecular weight of 25,000 to 500,000;
      (b) a solvent containing at least one C—F bond and comprising 3-ethoxyperfluoro (2-methylhexane), 1,1,1,2,2,3,3,4,4-nonafluoro-4-methoxybutane, 1,1,1,2,2,3,3,4,4-nonafluoro-4-ethoxybutane, 1,1,1,2,3,4,4,5,5,5-Decafluoropentane and/or 1H,1H,5H-Octafluoropentyl-1,1,2,2-tetrafluoroethyl ether; and
      (c) a rheology modifying component comprising fumed silica that is surface modified with hydrophobic functional groups.

2. The method of claim 1 wherein the substrate comprises at least one of copper, steel, a polyepoxide, fiberglass reinforced polyepoxide, a polyimide, a phenolic polymer, and a fluorocarbon polymer.

3. The method of claim 1 wherein the substrate is cleaned by argon plasma treatment prior to imprinting the electrically conductive circuit pattern on the surface of the substrate.

4. The method of claim 1 wherein the surface treatment composition demonstrates a thixotropic index greater than 2.

5. The method of claim 1, wherein the fluorine-containing polymer (a) has a weight average molecular weight of 25,000 to 250,000.

* * * * *